(12) United States Patent
Song (10) Patent No.: US 9,685,540 B2
(45) Date of Patent: Jun. 20, 2017

(54) SEMICONDUCTOR DEVICE HAVING A GATE THAT IS BURIED IN AN ACTIVE REGION AND A DEVICE ISOLATION FILM

(71) Applicant: SK hynix Inc., Icheon (KR)

(72) Inventor: Kang Yoo Song, Seongnam (KR)

(73) Assignee: SK HYNIX INC., Icheon (KR)

(*) Notice: Subject to any disclaimer, the term of this patent is extended or adjusted under 35 U.S.C. 154(b) by 0 days.

(21) Appl. No.: 15/191,221

(22) Filed: Jun. 23, 2016

(65) Prior Publication Data

US 2016/0308030 A1 Oct. 20, 2016

Related U.S. Application Data

(62) Division of application No. 14/340,489, filed on Jul. 24, 2014, now Pat. No. 9,401,301.

(30) Foreign Application Priority Data

Mar. 28, 2014 (KR) ........................ 10-2014-0036798

(51) Int. Cl.
*H01L 21/336* (2006.01)
*H01L 29/66* (2006.01)
*H01L 29/423* (2006.01)
*H01L 29/06* (2006.01)
*H01L 29/45* (2006.01)
*H01L 21/306* (2006.01)
*H01L 21/28* (2006.01)
*H01L 21/285* (2006.01)
*H01L 21/265* (2006.01)
(Continued)

(52) U.S. Cl.
CPC .. *H01L 29/66795* (2013.01); *H01L 21/26506* (2013.01); *H01L 21/26513* (2013.01); *H01L 21/28026* (2013.01); *H01L 21/28525* (2013.01); *H01L 21/30604* (2013.01); *H01L 21/31111* (2013.01); *H01L 21/32055* (2013.01); *H01L 21/76224* (2013.01); *H01L 29/0649* (2013.01); *H01L 29/4175* (2013.01); *H01L 29/41791* (2013.01); *H01L 29/4236* (2013.01); *H01L 29/456* (2013.01); *H01L 29/785* (2013.01); *H01L 21/3083* (2013.01)

(58) Field of Classification Search
CPC ........... H01L 29/66795; H01L 29/4175; H01L 21/26513; H01L 21/32055; H01L 21/31111; H01L 29/41791; H01L 29/785; H01L 21/26506; H01L 29/4236; H01L 29/0649; H01L 29/456; H01L 21/30604; H01L 21/28026; H01L 21/28525; H01L 21/76224; H01L 21/3083
See application file for complete search history.

(56) References Cited

U.S. PATENT DOCUMENTS 8,298,875 B1* 10/2012 Or-Bach ............. H01L 29/4236
257/E21.411
2013/0062679 A1 3/2013 Manabe
2013/0264621 A1 10/2013 Nishi et al.

* cited by examiner

*Primary Examiner* — Stephen W Smoot
*Assistant Examiner* — Vicki B Booker (57) ABSTRACT

A semiconductor device includes an active region with a first gate trench formed when a gate region is etched to a first depth, a device isolation film defining the active region and including a second gate-trench formed when a gate region is etched to a second depth, a gate buried below the first gate trench and the second gate trench, and a source plug and a drain plug formed when a conductive material is deposited in a source region and a drain region of the active region.

9 Claims, 6 Drawing Sheets (51) Int. Cl.
*H01L 21/762* (2006.01)
*H01L 29/417* (2006.01)
*H01L 29/78* (2006.01)
*H01L 21/311* (2006.01)
*H01L 21/3205* (2006.01)
*H01L 21/308* (2006.01)

SEMICONDUCTOR DEVICE HAVING A GATE THAT IS BURIED IN AN ACTIVE REGION AND A DEVICE ISOLATION FILM

CROSS-REFERENCE TO RELATED APPLICATION

The present application is a divisional of U.S. patent application Ser. No. 14/340,489 filed on Jul. 24, 2014 and now issued as U.S. Pat. No. 9,401,301, which claims the priority of Korean patent application No. 10-2014-0036798 filed on 28 Mar. 2014, the disclosures of which are hereby incorporated in their entireties by reference.

BACKGROUND OF THE INVENTION

Embodiments of the present invention relate to a semiconductor device having a fin channel.

As the integration degree of semiconductor devices increases, a design rule is reduced, such that the semiconductor device has difficulty maintaining a stable operation of transistors.

Specifically, as the size of an active region is reduced in a width direction, drive current characteristics are deteriorated, resulting in the occurrence of Write-Recovery Time (tWR) deterioration.

A more extended current path improves a drive current of the cell. A fin Field Effect Transistor (FinFET) has been used to secure a present current path.

However, there are limits to the amount that a conventional fin transistor can improve drive current and channel resistance by simply increasing fin increases in height. In addition, it is difficult to increase a drive current simultaneously while maintaining the ratio of width to length of a channel in a conventional fin transistor. Furthermore, it is difficult to construct a junctionless transistor using conventional technologies.

BRIEF SUMMARY OF THE INVENTION

Various embodiments of the present invention are directed to providing a semiconductor device having a fin-type channel (fin channel) and a method for forming the same that substantially obviate one or more problems due to limitations and disadvantages of the related art.

An embodiment of the present invention relates to a technology for extending a path of a drive current by improving a structure of a semiconductor device having a fin channel, resulting in improvement of the drive current of the semiconductor device.

In accordance with an aspect of the present invention, a semiconductor device includes: an active region including a first gate trench having a first depth; a first device isolation film defining the active region, and including a second gate trench having a second depth; a gate disposed in the first gate trench and the second gate trench; a source plug buried in a source region of the active region, the source plug including a conductive material; and a drain plug buried in a drain region of the active region, the drain plug including the conductive material.

In accordance with another aspect of the present invention, a method for forming a semiconductor device includes: forming a device isolation film defining an active region; forming a gate trench by etching the active region and the device isolation film; forming a buried gate in a lower portion of the gate trench; forming a source recess and a drain recess by etching a source region and a drain region of the active region; and forming a source plug and a drain plug by depositing a conductive material into the source recess and the drain recess.

It is to be understood that both the foregoing general description and the following detailed description of embodiments are exemplary and explanatory.

DESCRIPTION OF EMBODIMENTS

Reference will now be made in detail to certain embodiments, examples which are illustrated in the accompanying drawings. The same reference numbers refer to the same or like parts. In the following description, a detailed description of well-known configurations or functions may be omitted. Embodiments described in the specification and shown in the drawings are purely illustrative and are not intended to represent all aspects of the invention.

Figure 1:
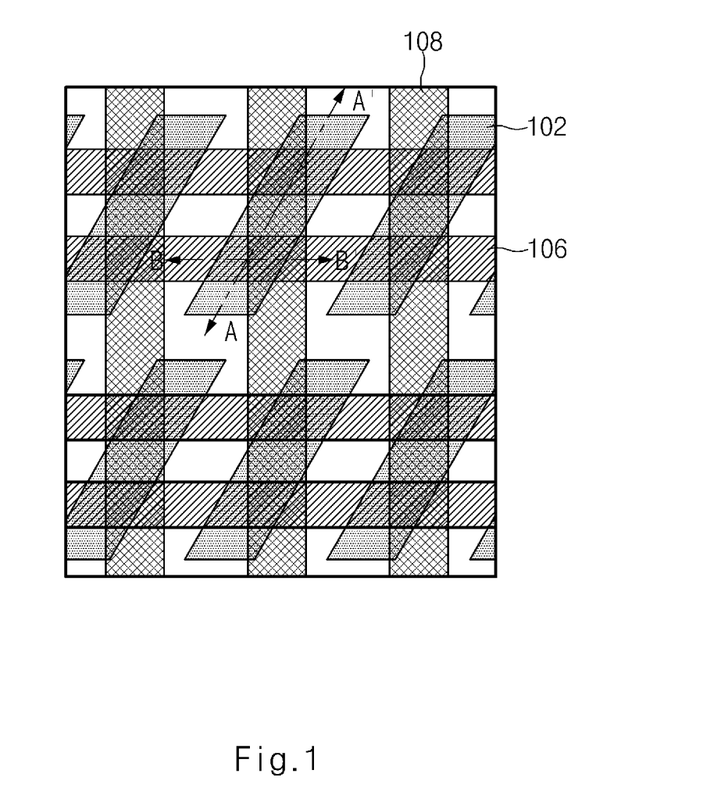
FIG. 1 is a plan view illustrating a semiconductor device according to an embodiment.
Figure 2:
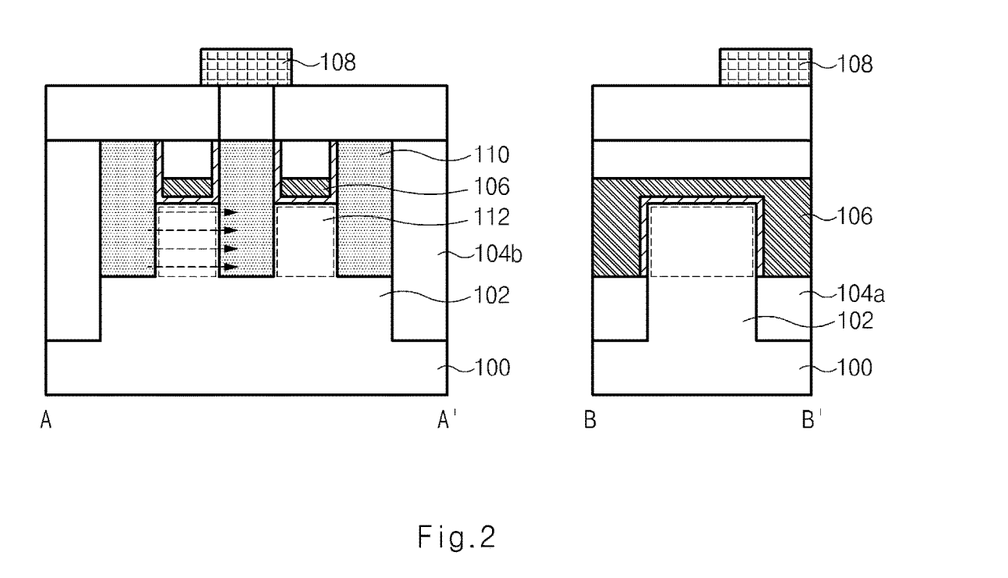
FIG. 2 illustrates two cross-sectional views taken along lines A-A' and B-B' of FIG. 1

FIG. 1 is a plan view illustrating a semiconductor device according to an embodiment. FIG. 2 shows two cross-sectional views taken along lines A-A' and B-B' of FIG. 1.

Referring to FIGS. 1 and 2, an active region 102 formed by etching a semiconductor substrate 100 is defined by a first device isolation film 104a and a second device isolation film 104b. The first device isolation film 104a is arranged parallel to a long-axis direction of the active region 102 and a line shaped second device isolation film 104b is arranged parallel to a buried gate 106, thereby isolating adjacent active regions 102 from each other. Several active regions 102 arranged adjacent to each other and spaced apart along a long axis of the buried gate 106. Each active region 102 may be coupled to two buried gates 106. A plurality of parallel and adjacent active regions 102 may be coupled to the same two buried gates 106, while a neighboring set of parallel adjacent active regions 102 are coupled to a next two buried gates 106.

Each active region 102 crosses two buried gates 106 and one bit line 108. In an embodiment, the active region 102 crosses the buried gates 106 and the bit line 108 at oblique angles, and the buried gates 106 cross the bit line 108. The buried gates 106 are buried in a linear gate trench etched in gate regions of the active region 102 and the first device isolation film 104a. In an embodiment, the gate trench in which each buried gate 106 is disposed has a fin structure in which the active region 102 protrudes further from the substrate 100 than the first device isolation film 104a because the first device isolation film 104a is more deeply etched than the active region 102. Therefore, the buried gate 106 is disposed over three sides of the active region 102. In an embodiment, a height of a fin structure is greater than a height of the gate 106 formed over the protruded active region (fin) 102.

The embodiment shown in FIG. 2 includes a plurality of source and drain plugs 110. The source and drain plugs 110 may be formed by depositing a conductive material in source and drain regions of a transistor. Bottom surfaces of the source and drain plugs 110 may define upper shoulders of fin-shaped active regions 102, and the shoulder height may be substantially level with a bottom surface of the gate 106 buried in the device isolation film 104a.

In other words, in an embodiment, source and drain regions are not formed by a conventional process of simply depositing different types of impurities into source and drain regions. Instead, recesses are be formed by etching source and drain regions to a fin depth and depositing conductive materials in the source and drain regions to form source and drain plugs 110. The conductive material may be a doped polysilicon or metal. Here, the fin depth is the height above which the active region (fin) protrudes above the first isolation film 104a.

A channel region 112 is disposed below the buried gate 106 in a portion of the active region 102 interposed between the source and drain plugs 110. As seen in FIG. 2, the source and drain plugs 110 are disposed at the same depth as a shoulder between adjacent fins such that a drive current may flow across an entire fin height as indicated by the horizontal arrows.

In other words, channel regions 112 surrounded by the buried gates 106 extend for the entire height of fins protruding from the device isolation film 104a. Accordingly, the amount of a drive current flowing in the channel region 112 for use in a semiconductor device according to an embodiment increases in proportion to the height of fin.

In an embodiment, the channel region 112 includes the same kind of impurity as the source and drain plugs 110. In such an embodiment, the source and drain region 110 and the channel region 112 may include the same kind of impurity, such that a transistor can be driven as a junctionless transistor. In this embodiment, the entire channel region 112 can be fully depleted by a gate voltage(negative voltage).

FIGS. 3 to 10 show cross-sectional views corresponding to lines A-A' and B-B' of FIG. 1 illustrating a method for forming a semiconductor devices according to an embodiment.

Figure 3:
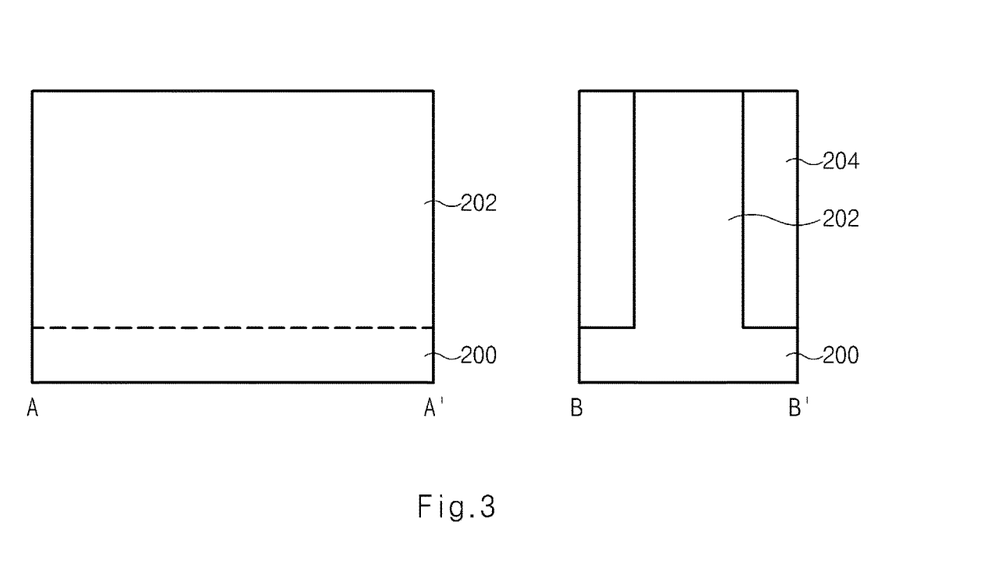
FIGS. 3 to 10 are cross-sectional views illustrating a method for forming the embodiment of FIGS. 1 and 2. Each of FIGS. 3 to 10 show two cross sectional views which correspond to the lines A-A' and B-B' of FIG. 1.

Referring to FIG. 3, a hard mask layer (not shown) is formed over a semiconductor substrate 200. The hard mask layer may include an oxide film.

Subsequently, after an ISO mask pattern (not shown) defining line-type active regions is formed over the hard mask layer, the hard mask layer is etched using the ISO mask pattern as an etch mask, such that a hard mask pattern (not shown) is formed. The ISO mask pattern may include a photoresist pattern, and may be formed by a Spacer Pattern Technology (SPT) process.

The semiconductor substrate 200 is etched using the hard mask pattern (not shown) as an etch mask, thereby forming a first device-isolation trench (not shown) defining a plurality of active regions 202 arranged in parallel lines. The active regions 202 may be arranged in lines that obliquely cross with a bit line and gate (word line) formed in subsequent processes.

Subsequently, an insulation film for device isolation is deposited to fill the first device-isolation trench, thereby forming a first device isolation film 204 defining line-type active region 202. The first device isolation film 204 may include a Spin On Dielectric (SOD) material having superior gapfill characteristics or a High Density Plasma (HDP) oxide film. In other embodiments, the device isolation film 204 may be formed of a nitride film, or may be formed of a stacked structure of an oxide film and a nitride film. Before forming the first device isolation film 204, a sidewall oxide film may be formed over a sidewall of the first device-isolation trench.

Figure 4:
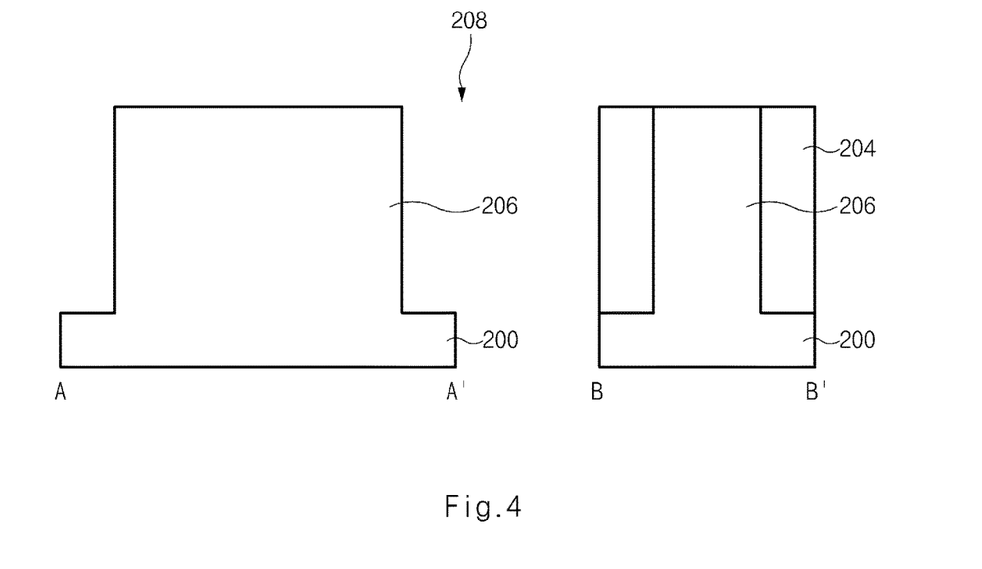

Referring to FIG. 4, an ISO cut-mask pattern (not shown) for cutting (or isolating) the line-type active region 202 in units of a predetermined length is formed over the active region 202 and the first device isolation film 204. Subsequently, the active region 202 and the first device isolation film 204 are etched in a line shape using the ISO cut-mask pattern as an etch mask, such that a second device-isolation trench 208 is formed to define an island-type active region 206. In an embodiment, the second device-isolation trench is formed in a line shape that extends parallel to a buried gate that is formed in a subsequent process.

Figure 5:
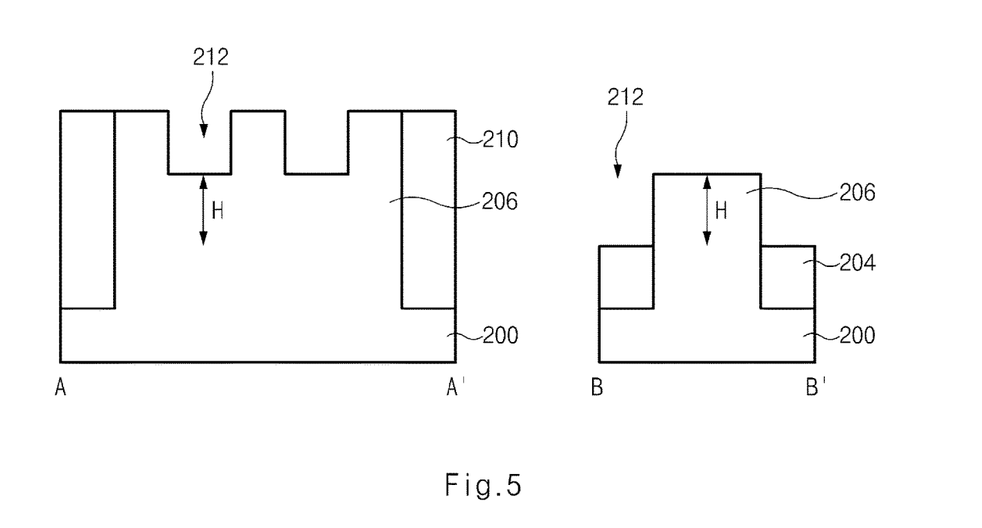

Referring to FIG. 5, a device-isolation insulation film is deposited to fill the second device-isolation trench 208 and then planarized, thereby forming a second device isolation film 210 that defines the island-type active region 206. In other words, the first and second device isolation film 204 and 210 are formed so that a plurality of island-type active regions 206 are arranged parallel in a line. In an embodiment, the second device isolation film 210 includes a nitride film, and a sidewall oxide film (e.g., a wall oxide film) may be formed over a sidewall of the second device-isolation trench 208 before formation of the second device isolation film 210.

A buried gate (BG) mask pattern (not shown) defining a gate region is formed over the active region 206 and the device isolation films (204, 210). This BG mask pattern may include a hard mask pattern.

Subsequently, the active region 206 and the first device isolation film 204 are etched using the BG mask pattern as an etch mask, thereby forming a gate trench 212. In an embodiment, the first device isolation film 204 is more deeply etched than the active region 206 so that the gate trench 212 has a fin structure in which the active region 206 protrudes further from the substrate 200 than the first device isolation film 204, and the height (H) of the fin structure is greater than that of a conventional fin structure.

In more detail, although a fin structure of the conventional art is formed to have a relatively large height, the size of a part in which an actual drive current flows is limited. More specifically, the extent of the field effect is relatively limited, so a channel region in a conventional field effect of a transistor has a limited size regardless of the depth of a fin which carries the channel current. In contrast, a semiconductor device according to an embodiment of the present invention may increase the drive current in proportion to the height of fin. Thus, the fin structure of an embodiment includes a fin that is taller than a conventional fin, and the drive current increases in proportion to the height of fin.

Figure 6:
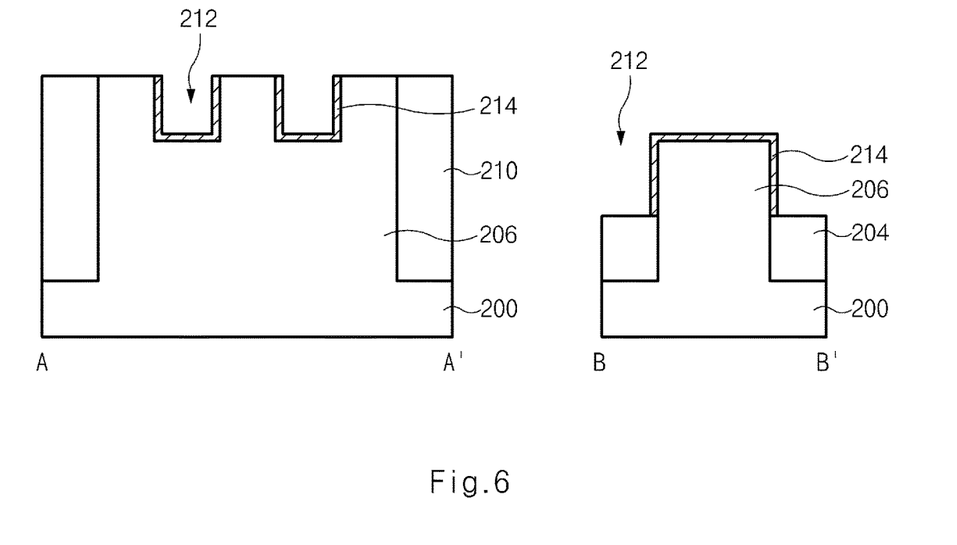

Referring to FIG. 6, a gate insulation film 214 is formed over a portion of the active region 206 exposed by the gate trench 212. The gate insulation film 214 may include an oxide film. The oxide film may be formed of a high-K material, for example, silicon oxide ($SiO_2$), silicon oxynitride (SiON), hafnium oxide ($HfO_2$), tantalum oxide ($Ta_2O_5$), etc. The gate insulation film 214 may be formed by depositing an oxide material over the active region 206, or by oxidizing a surface of the active region 206 through a dry or wet oxidation process.

Figure 7:
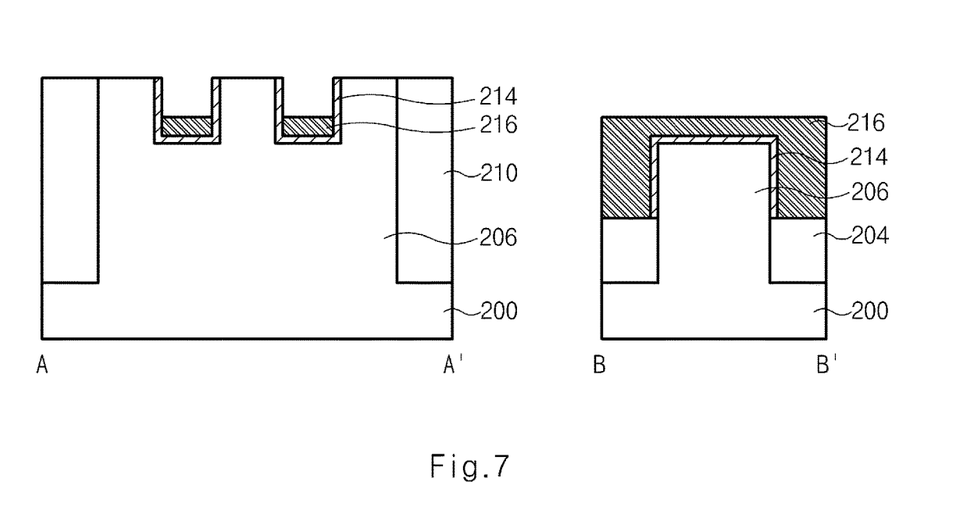

Referring to FIG. 7, a gate conductive film is formed over the gate insulation film 214 to fill the gate trench 212. The gate conductive film is then etched back, thereby forming a gate 216 buried in a lower portion of the gate trench 212.

The buried gate 216 may have a fin gate structure enclosing three sides (a top surface and both sides) of the protruded active region 206. The gate conductive film may include a metal (e.g., tungsten or titanium) material or a stacked structure of a metal and a barrier metal (e.g., titanium nitride). The portion of the buried gate 216 formed over the active region 206 may have a thickness of 100 Å or less.

Figure 8:
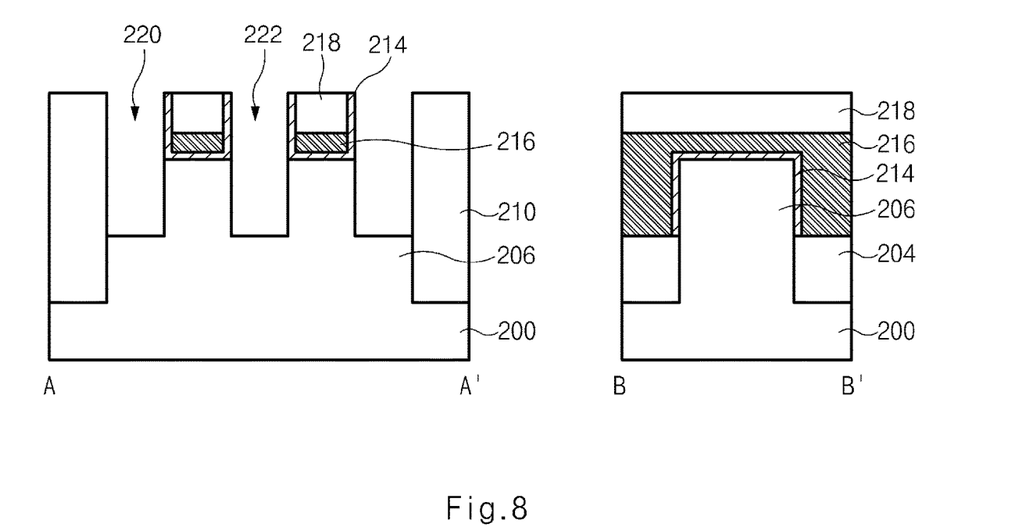

Referring to FIG. 8, a sealing film 218 is formed to fill the gate trench 212. Here, the sealing film 218 may include a nitride film which insulates the buried gate 216.

Subsequently, a source region is etched to form a source recess 220, and a drain region is etched to form a drain recess 222. In an embodiment, the bottom surfaces of the source recess 220 and the drain recess 222 may have the substantially same height as a top surface of the first device isolation film 204 etched when forming the gate trench 212. That is, the source recess 220 and the drain recess 222 may be formed at a depth corresponding to the depth of a fin.

Figure 9:
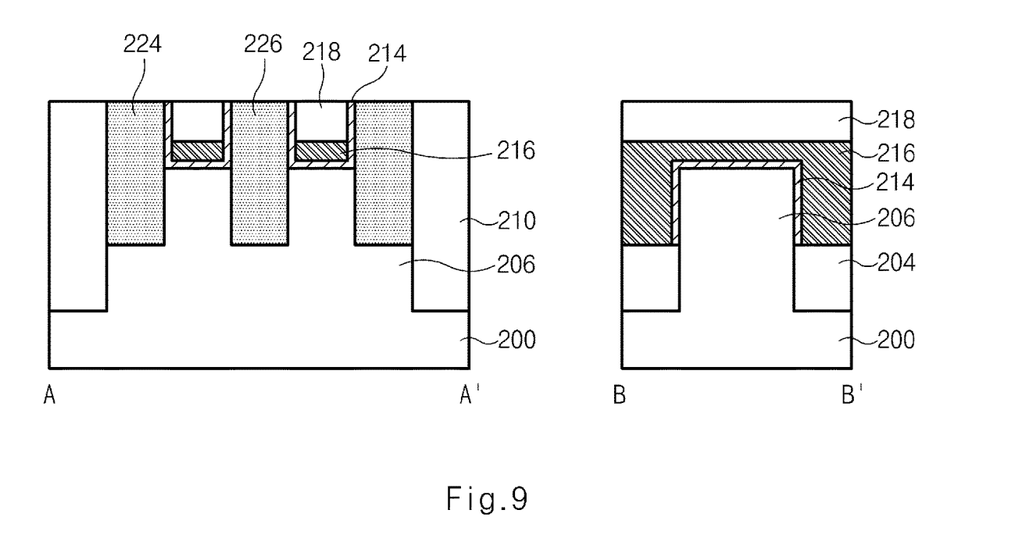

Referring to FIG. 9, a conductive material is deposited to fill the source recess 220 and the drain recess 222 and then planarized, thereby forming a source plug 224 in the source region and a drain plug 226 in the drain region. In other words, according to an embodiment, a source region and the drain are not formed by implanting impurities into the active region 206. Instead, the source region and the drain are formed by depositing a conductive material in the form of a plug on both sides of buried gate 216. The source plug 224 and the drain plug 226 may include doped polysilicon or metal. In an embodiment in which a metal material is used as a conductive material for a source and a drain, impurities are implanted in the source recess 220 and the drain recess 222 before the conductive material is buried, such that an impurity layer may be formed in boundary regions between the metal of the source plug and drain plug and a channel region of the active region 206.

In an embodiment, a semiconductor device including the source plug 224 and the drain plug 226 is annealed, such that the plug material is diffused into the active region 206.

Figure 10:
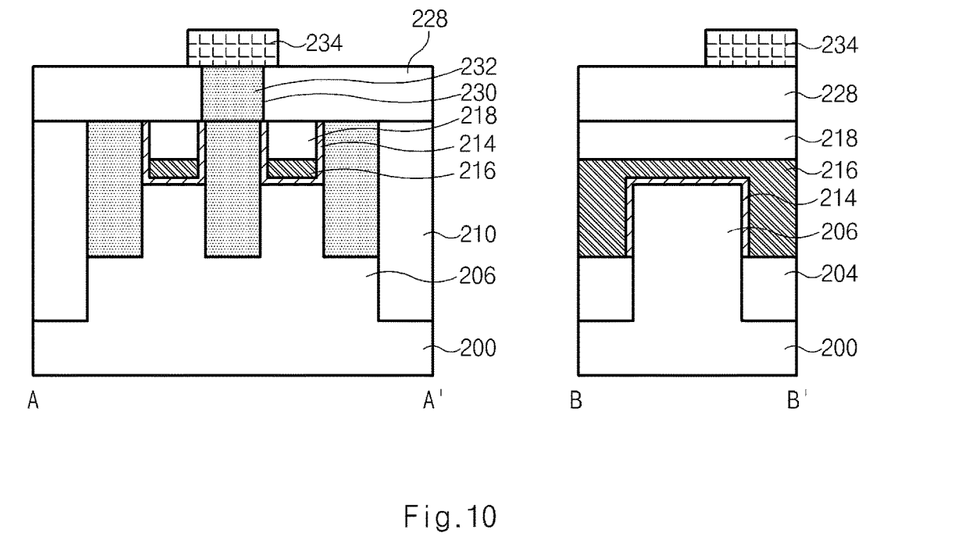

Referring to FIG. 10, after an interlayer insulation film 228 is formed over the semiconductor device, a bit line contact hole 230 exposing the drain plug 226 is formed. Subsequently, a conductive material is deposited in the bit line contact hole 230 to fill the hole and is then planarized, resulting in a bit line contact plug 232. The bit line contact plug 232 may be formed of the same material as the drain plug 226. For example, the bit line contact plug 232 may include a doped polysilicon material.

Thereafter, a conductive film (not shown) for a bit line and a hard mask layer (not shown) are formed over the bit line contact plug 232. The bitline conductive film may include a metal (e.g., tungsten or titanium) material or a stacked structure of a metal and a barrier metal (e.g., titanium nitride).

Subsequently, the hard mask layer and the bit line conductive film are etched using a mask pattern (not shown) defining a bit line region, thereby forming a bit line 234.

In an embodiment in which a polysilicon material is used as a conductive material for the source plug 224 and the drain plug 226, the same impurities (e.g., N-type impurities) as the source plug 224 and the drain plug 226 are implanted into an active region (channel region) between the source plug 224 and the drain plug 226, resulting in a junctionless transistor.

In such an embodiment, the impurity implantation process may include, for example, forming a gate trench 212 as shown in FIG. 5 and implanting impurities into a lower portion of the gate trench 212.

Figure 11:
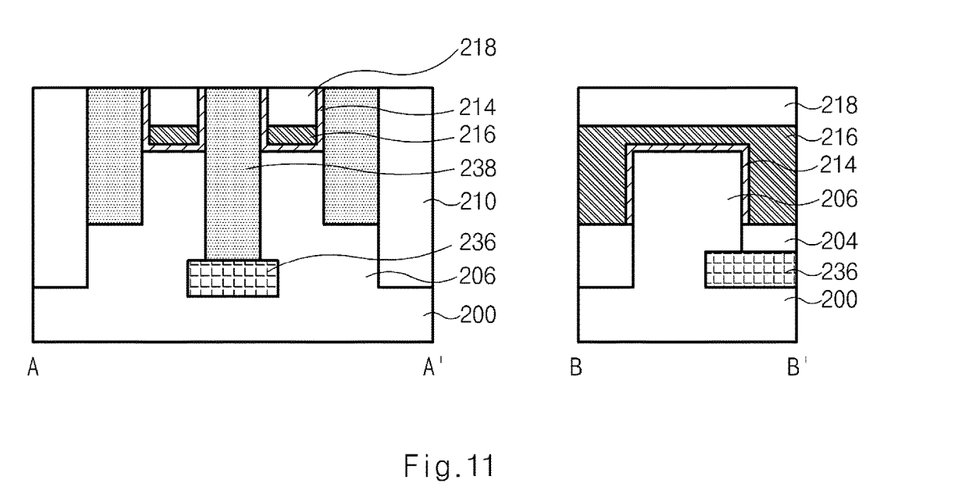
FIG. 11 illustrates cross sectional views of a semiconductor device according to another embodiment corresponding to lines A-A' and
B-B' of FIG. 1.

FIG. 11 is a cross-sectional view illustrating a semiconductor device according to another embodiment.

Referring to FIG. 11, a bit line 236 is buried in the active region 206 and first and second device isolation films 204 and 210 such that the bit line 236 has a buried bit line structure. After a bit line 236 is formed in the active region 206 and the device isolation films, a drain plug 238 is formed to be coupled to the buried bit line 236.

As is apparent from the above description, embodiments of the present invention can improve drive current characteristics of the semiconductor device having a fin channel.

Those skilled in the art will appreciate that embodiments may be carried out in other ways other than those set forth herein without departing from the spirit of this disclosure. The above embodiments are therefore to be construed in all aspects as illustrative and not restrictive.

The above embodiments are illustrative and not limitative. Various alternatives and equivalents are possible. The scope of this disclosure is not limited by the type of deposition, etching polishing, and patterning steps described herein. Furthermore, embodiments are not limited to any specific type of semiconductor device. For example, embodiments may be implemented in a dynamic random access memory (DRAM) device or nonvolatile memory device. Other additions, subtractions, or modifications are obvious in view of the present disclosure and are intended to fall within the scope of the appended claims.

What is claimed is:

1. A method for forming a semiconductor device, comprising:
   forming a device isolation film defining an active region;
   forming a gate trench by etching the active region and the device isolation film;
   forming a buried gate in a lower portion of the gate trench;
   forming a source recess and a drain recess by etching a source region and a drain region of the active region; and
   forming a source plug and a drain plug by depositing a conductive material into the source recess and the drain recess.

2. The method according to claim 1, wherein forming the gate trench includes:
   etching the device isolation film more deeply than the active region so that the active region protrudes in a fin structure.

3. The method according to claim 2, wherein forming the source recess and the drain recess includes:
   etching the source region and the drain region to a depth of the fin structure.

4. The method according to claim 2, wherein, in a direction parallel to the buried gate, the buried gate is over the fin, and a height of a portion of the buried gate over the fin is less than a height of the fin.

5. The method according to claim 1, further comprising:
   annealing the source plug and the drain plug.

6. The method according to claim 1, wherein forming the source plug and the drain plug includes:
   depositing a doped polysilicon material or a metal material in the source recess and the drain recess.

7. The method according to claim 1, wherein forming the source plug and the drain plug includes:
   implanting impurities into the source recess and the drain recess; and
   depositing a metal material in the source recess and the drain recess.

8. The method according to claim 1, wherein the source plug and the drain plug each include a first type of impurities, the method further comprising:
  implanting the first type of impurities into a channel region of the active region disposed between the source plug and the drain plug.

9. The method according to claim 1, wherein forming the device isolation film includes:
  forming first device isolation trenches by etching a semiconductor substrate, the first device isolation trenches defining a plurality of linear first active regions parallel to one another;
  forming a first device isolation film by depositing a first insulation film in the first device isolation trench;
  forming a second device isolation trench defining a plurality of island type second active regions by etching the first active region and the first device isolation film in a direction parallel to the gate; and
  forming a second device isolation film by depositing a second insulation film in the second device isolation trench.

* * * * *